United States Patent
Kugler

(10) Patent No.: US 7,952,090 B2
(45) Date of Patent: May 31, 2011

(54) ELECTROCHEMICAL THIN-FILM TRANSISTOR

(75) Inventor: Thomas Kugler, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 249 days.

(21) Appl. No.: 12/155,707

(22) Filed: Jun. 9, 2008

(65) Prior Publication Data

US 2009/0040587 A1 Feb. 12, 2009

(30) Foreign Application Priority Data

Jun. 8, 2007 (GB) .................................. 0711076.0

(51) Int. Cl.
*H01L 51/30* (2006.01)

(52) U.S. Cl. ............... 257/40; 257/E29.068; 257/E29.1; 257/E51.027

(58) Field of Classification Search ............ 257/40, 257/E39.007, E51.001, E51.002, E51.004, 257/E51.007, E51.01, E51.011, E51.013, 257/E51.015, E51.027, E29.068, E29.1
See application file for complete search history.

(56) References Cited

U.S. PATENT DOCUMENTS

| | | | |
|---|---|---|---|
| 6,833,059 B2 | 12/2004 | Kawarada | |
| 2002/0134980 A1* | 9/2002 | Armgarth et al. | 257/59 |
| 2002/0158295 A1 | 10/2002 | Armgarth et al. | |
| 2003/0111670 A1 | 6/2003 | Misra et al. | |
| 2004/0211989 A1* | 10/2004 | Armgarth et al. | 257/253 |
| 2005/0201143 A1* | 9/2005 | Pinnow et al. | 365/149 |
| 2006/0202289 A1 | 9/2006 | Armgarth et al. | |
| 2007/0108068 A1* | 5/2007 | Suh et al. | 205/766 |
| 2007/0138463 A1* | 6/2007 | Herlogsson et al. | 257/40 |

FOREIGN PATENT DOCUMENTS

| | | |
|---|---|---|
| SE | 0100748-3 C2 | 6/2003 |
| WO | WO 02/071505 A1 | 9/2002 |
| WO | WO 03/047009 A1 | 6/2003 |

OTHER PUBLICATIONS

"Molecular Ordering of Organic Molten Salts Triggered by Single-Walled Carbon Nanotubes". Fukushima et al. Science; Jun. 27, 2003; 300, 5628; Research Library p. 2072.*
"Review of recent progress in solid-state dye-sensitized solar cells." Wang et al. ScienceDirect. Jun. 28, 2005.*
Kawai et al., "A Flexible 2-in. QVGA LTPS-TFT Electrophoretic Display," *SID International Symposium, Seminar and Exhibition*, Boston, 2005, pp. 1638-1641.
Tam et al., "The Design and Driving of Active-Matrix Electrochromic Displays Driven by LTPS TFTs," *SID International Symposium, Seminar and Exhibition*, San Francisco, 2006, pp. 33-36.

(Continued)

*Primary Examiner* — A. Sefer
*Assistant Examiner* — Allen L Parker
(74) *Attorney, Agent, or Firm* — Oliff & Berridge PLC

(57) ABSTRACT

An electrochemical transistor comprising an electrolyte is disclosed. The electrolyte includes an ionic liquid. In a preferred embodiment, the transistor further comprises a source electrode, a drain electrode separated from the source electrode so as to form a gap between the source and drain electrodes, a semiconductor layer bridging the gap between the source and drain electrodes to form a transistor channel, and a gate electrode separated from the source electrode, the drain electrode and the semiconductor layer. In this embodiment, the electrolyte is disposed so as to contact at least a part of both the semiconductor layer and the gate electrode.

20 Claims, 8 Drawing Sheets

OTHER PUBLICATIONS

Veres et al., "Low-*k* Insulators as the Choice of Dieletries in Organic Field-Effect Transistors," *Advanced Functional Materials*, vol. 13, No. 3, Mar. 2003, pp. 199-204.

Elschner, "High conductive PEDOT/PSS—a polymeric alternative to inorganic TCOs," *XIIIth International Seminar: Commercial Application of Conductive Polymers*, Florence, Italy, Oct. 9-11, 2006.

Morvant et al., "In situ conductivity studies of poly (3,4-ethylenedioxythiophene)," *Synthetic Materials*, vol. 92, 1998, pp. 57-61.

Nilsson et al., "Bi-stable and Dynamic Current Modulation in Electrochemical Organic Transistors," *Advanced Materials*, vol. 14, No. 1, Jan. 4, 2002, pp. 51-54.

Taniguchi et al., "Vertical electrochemical transistor based on poly(3-hexylthiophene) and cyanoethylpullulan," *Applied Physics Letters*, vol. 85, No. 15, Oct. 11, 2004, pp. 3298-3300.

Chao et al., "Solid-State Microelectrochemistry: Electrical Characteristics of a Solid-State Microelectrochemical Transistor Based on Poly)3-methylthiophene)," *Journal of American Chemical Society*, vol. 109, No. 7, 1987, pp. 2197-2199.

Backlund et al., "Current modulation of a hygroscopic insulator organic field-effect transistor," *Applied Physics Letters*, vol. 85, No. 17, Oct. 25, 2004, pp. 3887-3889.

Panzer et al., "Low-voltage operation of a pentacene field-effect transistor with a polymer electrolyte gate dielectric," *Applied Physics Letters*, vol. 86, 2005, pp. 103503-1-103503-3.

Robinson et al., "On the Current Saturation Observed in Electrochemical Polymer Transistors," *Journal of The Electrochemical Society*, vol. 153, No. 3, 2006, pp. H39-H44.

Barsch et al., "Anodic Overoxidation of Polythiophenes in Wet Acetonitrile Electrolytes," *Electrochimica Acta*, vol. 41, No. 11/12, 1996, pp. 1761-1771.

Sakai et al., "Effect of Cl Ionic Solutions on Electrolyte-Solution-Gate Diamond Field-Effect Transistors," *Japanese Journal Of Applied Physics*, vol. 41, 2002, pp. 2595-2597.

Lu et al., "Stable Conductiong Polymer Electrochemical Devices Incorporating Ionic Liquids," *Synthetic Materials*, vol. 135-136, 2003, pp. 139-140.

* cited by examiner

ELECTROCHEMICAL THIN-FILM TRANSISTOR

FIELD OF THE INVENTION

Several aspects of the present invention relate to an electrochemical thin film transistor particularly suitable for use in flexible, light-weight and reflective paper-like displays ("electronic paper").

BACKGROUND OF THE INVENTION

In "electronic paper" displays, an active matrix backplane based on Thin Film Transistors (TFTs) is used to address the display front-plane that contains the active display medium, which changes its optical properties in response to the application of an electric field (e.g. in liquid crystalline (LCD) or electrophoretic (EPD) displays), or the passage of electric current (e.g. in electrochromic displays, ECD).

Electrophoretic displays (EPDs) are electric field-driven, i.e. switching requires relatively large voltages (approx. 10V), but only very low current levels. An EPD based on a low-temperature polycrystalline silicon active matrix backplane has recently been presented [see SID International Symposium, Seminar, and Exhibition 2005, Boston, USA; paper 54.3: "A Flexible 2-in. QVGA LTPS-TFT Electrophoretic Display"; H. Kawai, M. Miyasaka, A. Miyazaki, T. Kodaira, S. Inoue, and T. Shimoda of Seiko-Epson Corp., Nagano, Japan, and K. Amundson, R. J. Paolini, Jr., M. D. McCreary, and T. H. Whitesides of E-Ink Corp., MA, USA].

An alternative technology for realizing active matrix backplanes is Organic Field Effect Transistor (OFET) technology, which is based on polymeric, oligomeric, or small molecular semiconducting organic materials. The charge carrier mobility in such organic semiconductors is several orders of magnitude lower than in high-performance inorganic semiconductors such as silicon, which results in correspondingly lower source-drain current levels. Furthermore, due to the larger thickness and lower dielectric constant of the polymeric dielectric layers in OFETs, the gate voltages required for turning the transistor on are higher as compared to silicon TFTs with thin $SiO_2$ dielectric layers. However, the performance of OFETs matches the requirements for driving electrophoretic displays in terms of driving voltage and current levels. Furthermore, an important advantage of OFETs as compared to silicon TFTs is that they can be produced using cost-effective printing technologies (pad, screen, or inkjet printing) for the additive patterning of device components. An example is the inkjet printing of semiconducting polymers to form a transistor channel between source and drain electrodes, and the inkjet printing of silver colloid to form gate electrode lines in top-gate polymer OFETs.

OFETs work in an accumulation mode, i.e. the charge carriers accumulate in the transistor channel in response to the gate voltage applied in the ON-state. In the OFF-state, when no gate voltage is applied, the residual charge carrier concentration (due to unintentional doping of the semiconductor) should be as low as possible in order to avoid crosstalk between neighboring pixels, and in order to maximize the bi-stability of the display pixel switching states.

In contrast to EPDs, electrochromic displays (ECDs) operate at very low driving voltages (0-2V), but require relatively high current levels for switching the pixel coloration states. An active matrix ECD demonstrator comprising inkjet-printed $TiO_2$-particle pixel electrodes, a viologen-based electrochrome, and a polycrystalline silicon TFT back-plane has recently been presented [see SID International Symposium, Seminar and Exhibition 2006, San Francisco, USA; paper 4.5: "The Design and Driving of Active-Matrix Electrochromic Displays Driven by LTPS TFTs", S. W-B. Tam, B. McGregor, and M. Ishida of Cambridge Research Laboratory of Epson, Cambridge, U.K., H. Kawai, S. Nebashi, and T. Shimoda of Seiko-Epson Corp., Nagano, Japan, and D. Corr, U. Bach, N. Leyland, F. Pichot, and P. Brien of NTERA, Ltd., Dublin, Ireland].

A major obstacle in using OFETs as switching transistors for ECDs is the low current output of OFETs. This results in prohibitively long switching times for updating the information content in ECDs based on OFETs.

As discussed above, the low current levels in OFETs are due to the low charge carrier mobility in most organic semiconductors, combined with a relatively low charge carrier concentration in the transistor ON-state. The latter is partly due to the large thickness and low dielectric constants of the dielectric polymer layers commonly used in OFETS. These factors lead to the specific capacitance of the transistor channel in OFETs being small in comparison to silicon TFTs, which also results in, high gate voltages of the order of several tens of Volts being required for turning the transistor channel on. Lowering the gate voltage by reducing the thickness of the dielectric layer in an OFET is difficult because a thinner dielectric polymer layer results in increased leakage currents and the risk of a dielectric breakdown. Furthermore, whilst increasing the dielectric constant of the dielectric polymer results in an increased gate capacitance, it generally decreases the charge carrier mobility at the semiconductor-dielectric interface [see "Low-k Insulators as the Choice of Dielectrics in Organic Field-Effect Transistors", J. Veres, S. D. Ogier, S. W. Leeming, D. C. Cupertino, S. Mohialdin Khaffaf, Adv. Funct. Mat. 13, 199 (2003)].

Whereas the low current levels provided by OFETs are presently not sufficient to drive ECD pixels, an alternative technology based on electrochemical transistors (ECTs) has been demonstrated to provide high current levels. In such ECTs, the transistor channel is bridged by an electrochemically active, conducting polymer such as p-doped PEDOT-PSS. Adjacent to the conducting polymer layer, an electronically insulating but ionically conducting electrolyte layer in contact with a counter electrode ("gate electrode") allows an electric field to be applied to the electrochemically active material in the transistor channel (the "working electrode", in terms of electrochemistry), thus changing its oxidation state. When the conducting polymer is reduced from its p-doped (conducting) form to its neutral (semiconducting) form, the conductivity drops drastically.

ECTs based on conducting polymers, which are stable in their p-doped state, operate in a depletion mode. Prior to application of the gate voltage, the transistor is in an electrochemically stabilized ON-state, where negatively charged counterions are present in the bulk of the conjugated polymer, balancing the positive charges on the polymer chains, and thereby allowing for much higher charge carrier densities as compared to conventional OFETs in their ON-state. Due to this increased charge carrier density, ECTs can deliver much higher current levels than OFETs. Application of a positive gate voltage relative to the source contact switches the transistor channel from its initially p-doped ON-state to its electrochemically reduced OFF-state [see US2006202289, WO03047009, WO02071505 and SE0100748].

For p-doped PEDOT-PSS, conductivities in excess of 500 S/cm can be achieved [see H. Elschner of H. C. Starck GmbH, Germany, "High conductive PEDOT/PSS—a polymeric alternative to inorganic TCO"; presented at the "XIIIth International Seminar: Commercial Applications of Conductive Polymers", Oct. 9-11, 2006, at the Villa La Pietra, Florence, Italy], while the conductivity drops to below 0.01 S/cm upon reduction to the neutral state of PEDOT [see J. R. Reynolds, and M. C. Morvant, Synth. Met. 92, 57 (1998)]. For ECTs based on PEDOT-PSS and operating with highly resistive electrolytes, ON/OFF ratios exceeding $10^5$ have been reported [see D. Nilsson, M. Chen, T. Kugler, T. Remonen, M. Armgarth, and M. Berggren, Adv. Mater. 14, 51 (2002)].

Another variant of ECTs is based on organic semiconductors that are stable in their neutral, non-doped state, i.e. the same organic semiconductor materials as are commonly used in OFETs [see T. Masateru and K. Tomoji, "Vertical electrochemical transistor based on poly(3-hexylthiophene) and cyanoethylpullulan", Appl. Phys. Lett. 85, 3298 (2004); S. Chao and M. S. Wrighton, "Solid State Microelectrochemistry: Electrical Characteristics of a Solid State Microelectrochemical Transistor Based on Poly(3-methylthiophene)", J. Am. Chem. Soc. 109, 6627 (1987); and T. G. Bäcklund, H. G. O, Sandberg, R. Österbacka, and H. Stubb, "Current modulation of a hygroscopic insulator organic field-effect transistor", Appl. Phys. Lett. 85, 3887 (2004)].

Furthermore, an electrochemical transistor based on a hydrogen-terminated diamond layer as an inorganic semiconductor which is gated by a water-based liquid electrolyte has been described in U.S. Pat. No. 6,833,059.

As in ECTs based on conducting polymers, the neutral organic semiconductor in the transistor channel is gated electrochemically with an electrolyte comprising mobile ions. However, these devices work in an accumulative mode, i.e. prior to the application of the gate voltage, the transistor is in its non-doped OFF-state. Applying a negative voltage to the gate (counter) electrode then results in electrochemical doping of the transistor channel and switching to the ON-state.

Both variants of ECTs have the benefit of operating at very small gate voltages (0V to −2V). The electrochemical doping and de-doping processes of the material in the transistor channel are driven by the potential applied between the gate (counter) electrode and the polymer in the transistor channel (working electrode). In contrast to OFETs, where the electric field extends throughout the dielectric layer between the transistor channel and the gate electrode, the electric field in electrolyte-gated ECTs is confined to the electrolytic double layer capacitances formed at the interfaces between the electrolyte and the transistor channel and gate electrode, respectively. As the specific capacitance of electrolytic double layers ($\mu F/cm^2$) is far larger than the specific capacitance in conventional OFETs ($nF/cm^2$), the gate voltages required for switching ECTs are drastically reduced as compared to OFETs [see M. J. Panzer, C. R. Newman, and C. D. Frisbie, "Low-voltage operation of a pentacene field-effect transistor with a polymer electrolyte gate dielectric", Appl. Phys. Lett. 86, 103503 (2005)].

Furthermore, the amplitude of the conductivity change in ECTs is independent of the distance between the gate electrode and the transistor channel, i.e. the thickness of the electrolyte layer. This allows lateral transistor configurations to be used, where the gate electrode is patterned from the same PEDOT-PSS layer as the source and drain contacts, at a distance of millimeters from a conjugated polymer channel [see D. Nilsson, M. Chen, T. Kugler, T. Remonen, M. Armgarth, and M. Berggren, "Bi-stable and Dynamic Current Modulation in Electrochemical Organic Transistors", Adv. Mater. 14, 51 (2002)].

The doping state within a conjugated polymer in the transistor channel of an ECT depends on its electrical potential relative to the potential of the surrounding electrolyte (which is controlled by the gate counter electrode). When a voltage is applied between the source and drain contacts, the difference between the electrical potential within the conjugated polymer and the surrounding electrolyte changes along the transistor channel. Consequently, the degree of doping within the transistor channel becomes a function of the position relative to the source and drain electrodes. This variation of the doping degree as a function of position results in a concomitant change of the local conductivity within the transistor channel, and the occurrence of current saturation (pinch-off) at low source-drain voltages (i.e. when the magnitude of the source-drain voltage $|V_{DS}|$ less than the magnitude of the gate voltage $|V_G|$) in the output characteristics of ECTs [see N. D. Robinson, P.-O, Svensson, D. Nilsson, and M. Berggren, "On the Current Saturation Observed in Electrochemical Polymer Transistors", J. Electrochem. Soc. 153 H39 (2006)].

The use of electrolytes for addressing the transistor channel in ECTs, replacing the dielectric layer of OFETs, solves the problems of the low charge carrier concentrations and current levels of OFETs. Instead of dropping over the entire thickness of the dielectric layer, the potential difference between the gate electrode and the semiconductor material in the transistor channel of an ECT drops within the electrolytic double layer capacitances that are formed at the interfaces between the electrolyte and the gate electrode, and the electrolyte and the semiconductor in the transistor channel. As the thickness of these electrolytic double layer capacitances is far less than the thickness of the dielectric polymer layers commonly used in OFETs, the electric field strength within the electrolytic double layers, and hence the specific capacitance of the electrolytic double layers, are far larger than the electric field and the gate capacitance in conventional OFETs (of the order of $\mu F/cm^2$ instead of $nF/cm^2$). Correspondingly, the charge carrier concentration for a given gate voltage is drastically increased by the use of ECTs, and the gate voltages required for switching ECTs are drastically reduced as compared to OFETs.

Furthermore, the influx of counterions from the electrolyte into the bulk of the semiconductor in the transistor channel of an ECT during electrochemical doping stabilizes the charge carriers in the semiconductor material and thereby allows for even higher charge carrier concentrations.

However, a problem arises in the use of ECTs due to the electrochemical degradation of organic semiconductors in common electrolytes. The accumulation of holes (i.e. the formation of reactive carbo-cations, in chemical terminology) in the semiconductor material of an ECT at highly positive potentials often results in chemical reactions with species in the electrolyte, resulting in the disruption of the conjugated system and the irreversible loss of electrochemical activity. An example is the electrochemical degradation of polyaniline, which may occur very rapidly in aqueous electrolytes, due to nucleophilic attacks that result in the hydrolysis of the polymer chain.

Likewise, polythiophene films are easily "over-oxidised" in water-containing electrolytes, with both the degree of "over-oxidation" and the potential at which it occurs being highly dependent on the amount of water present in the electrolyte. The mechanism proposed to explain the "over-oxidation" of polythiophenes involves the oxidation of the sulphur atoms in the thiophene rings, followed by elimination of $SO_2$ [see "Anodic overoxidation of polythiophenes in wet acetonitrile electrolytes", Barsch, U. and F. Beck, Electrochimica Acta 41, 1761 (1996)].

In addition, the stability of the electrolyte itself is a major problem for electrochemical transistors (ECTs). Electrolytes need to have a constant, high ionic conductivity, a large electrochemical window within which the electrolyte is neither reduced nor oxidized at the cathode or anode, fast ion mobility during the redox intercalation/de-intercalation reactions, low volatility, and environmental stability.

Whilst proton-conductors allow for high ionic conductivities (e.g. Nafion displays 0.1 S/cm), acidic electrolytes are easily reduced at the cathode and result in the formation of hydrogen. Another issue with both water-based and organic solvent-based electrolytes is that they will eventually dry out and therefore require hermetic encapsulation to ensure a long device lifetime. The problem of solvent evaporation can be circumvented by using polymer-based solid electrolytes (such as Li salts dissolved in polyethylene oxide (PEO)). However, such solid electrolytes display comparatively low ionic conductivities.

SUMMARY OF THE INVENTION

According to an aspect of the present invention, there is provided an electrochemical transistor comprising an electrolyte, the electrolyte including an ionic liquid.

In the present invention the use of electrolytes based on ionic liquids in ECTs solves the problem of over-oxidation of the organic semiconductor materials in ECTs because ionic liquids do not cause electrochemical degradation of commonly used organic semiconductors.

The problems relating to the stability of the electrolyte in ECTs are also solved by using ionic liquids as electrolytes. Ionic liquids are salts that are molten over a wide temperature range, with a negligible vapor pressure at room temperature. Electrolytes based on ionic liquids will therefore not dry out, but maintain a high ionic conductivity (of the order of 1-10 mS/cm). Ionic liquids also display good environmental and electrochemical stability (e.g. EMI-TFSI has a large electrochemical window of 4.3V) and allow for fast redox intercalation/de-intercalation reactions.

Preferably, the electrochemical transistor further comprises:
 a source electrode;
 a drain electrode separated from the source electrode so as to form a gap between the source and drain electrodes;
 a semiconductor layer bridging the gap between the source and drain electrodes to form a transistor channel; and
 a gate electrode separated from the source electrode, the drain electrode and the semiconductor layer;
 wherein the electrolyte is disposed so as to contact at least a part of both the semiconductor layer and the gate electrode.

Suitably, the electrochemical transistor further comprises an ion storage layer disposed between the gate electrode and the electrolyte. The ion storage layer acts as an ion sink and source during the switching of the electrochemical transistor. Oxidation and reduction of the ion storage layer compensates for the charge transfer to and from the electrolyte involved in doping and de-doping the semiconductor layer of the transistor.

Preferably, the semiconductor layer comprises a p-type semiconductor material and the ion storage layer comprises an electrochemically active material that can be switched reversibly between an oxidized redox state and a reduced redox state. Suitably, the ion storage layer comprises a metal oxide.

Alternatively, the semiconductor layer comprises a p-type semiconductor material and the ion storage layer comprises an electrochemically active material that can be switched reversibly between an intermediate redox state and a reduced redox state. Suitably, the ion storage layer comprises polyaniline. Conveniently, the ion storage layer comprises Prussian Blue.

In one embodiment, the semiconductor layer comprises a p-type semiconductor material and the ion storage layer comprises an electrochemically active material that can be switched reversibly between a neutral redox state and an n-doped redox state. Preferably, the ion storage layer comprises an n-type semiconductor material.

Suitably, the semiconductor layer comprises an n-type semiconductor material and the ion storage layer comprises an electrochemically active material that can be reversibly switched between an intermediate redox state and an oxidized redox state. Preferably, the ion storage layer comprises polyaniline. Conveniently, the ion storage layer comprises Prussian Blue.

In one embodiment, the semiconductor layer comprises an n-type semiconductor material and the ion storage layer comprises an electrochemically active material that can be reversibly switched between a neutral redox state and a p-doped, oxidized redox state. Preferably, the ion storage layer comprises a p-type semiconductor material.

Suitably, the semiconductor layer comprises at least one p-type semiconductor material selected from an organic material and a metal-organic complex. Preferably, the semiconductor layer comprises at least one organic material selected from a material having small molecules, an oligomeric material and a polymeric material. More preferably, the semiconductor layer comprises pentacene, phthalocyanine, tetrabenzoporphyrine, (biphenyl)tetrathiafulvalene or analogues of these compounds. Alternatively, the semiconductor layer comprises di-hexyl quaterthiophene, alpha-sexithiophene, a thiophene-phenylene oligomer, or a thiophene-thiazole oligomer.

Suitably, the semiconductor layer comprises poly[3-hexylthiophene], poly[5,5'-bis(3-dodecyl-2-thienyl)-2,2'-bithiophene] or poly[9,9-dioctylfluorene-co-bithiophene].

In one embodiment, the semiconductor layer comprises at least one metal-organic complex material selected from a material having small molecules, an oligomeric material and a polymeric material.

Suitably, the semiconductor layer comprises at least one n-type semiconductor material selected from an organic material, an inorganic material and a metal-organic complex.

Conveniently, the semiconductor layer comprises at least one organic material selected from a material having small molecules, an oligomeric material and a polymeric material. Preferably, the semiconductor layer comprises one of perylenetetracarboxylicacid dianhydride (PTCDA), dimethylperylenetetracarboxylicacid diimide (MePTCDI), fullerene (C60), C60-fused pyrrolidine-meta-C12 phenyl (C60MC12), and [6,6]-phenyl C61-butyric acid methyl ester (PCBM).

Suitably, the semiconductor layer comprises at least one inorganic material selected from a metal oxide and a metal chalcogenide.

Conveniently, the semiconductor layer comprises at least one metal-organic complex having small molecules.

Preferably, the source, drain, and gate electrodes each comprise an electrochemically inert material. Suitably, an interface area between either the gate electrode, if no ion storage layer is present, or the ion storage layer, if an ion storage layer is present, and the electrolyte is much larger than an interface area between the electrolyte and the transistor channel. Preferably, a surface of either the gate electrode, if no ion storage layer is present, or the ion storage layer, if an ion storage layer is present, in contact with the electrolyte is porous. More preferably, the surface of the gate electrode or the ion storage layer comprises a material in the form of nano-particles or nano-tubes.

Suitably, the semiconductor layer is porous.

Preferably, the ionic liquid is electrochemically inert. Conveniently, the ionic liquid is triethylsulphonium bis(trifluoromethylsulfonyl)imide, N-methyl-N-trioctylammonium bis(trifluoromethylsulfonyl)imide, N-butyl-N-methylpyrrolidinium bis(trifluoromethylsulfonyl)imide, 1-ethyl-3-methylimidazolium tetrafluoroborate, 1-ethyl-3-methylimidazolium trifluoromethylsulfonate, or 1-ethyl-3-methylimidazolium bis(trifluoromethylsulfonyl)imide.

Preferably, the electrolyte further comprises a combination of at least two electrochemically active additives, which constitute at least one electrochemically reversible redox couple. Suitably, the electrolyte comprises at least one redox couple selected from $I^-/I_3^-$, $SCN^-/(SCN)_3^-$, $SeCN^-/(SeCN)_3^-$ and $[Co(bipyridine)_2]^{3+/2+}$.

In one embodiment, an anion component of the ionic liquid is electrochemically active and can be reversibly oxidized. Preferably, the ionic liquid is 1-Ethyl-3-methyl-imidazolium thiocyanate, 1-Ethyl-3-methyl-imidazolium selenothiocyanate, 1-Ethyl-3-methyl-imidazolium dicyanamide, 1-Methyl-3-propyl-imidazolium iodide, or 1-butyl-3-methylimidazolium bromide. Conveniently, the electrolyte further comprises the corresponding oxidation product of the anion component of the ionic liquid dissolved in the ionic liquid, said oxidation product forming a reversible redox couple in combination with the anion component of the ionic liquid.

Preferably, the oxidation product is one of $I_3^-$, $Br_3^-$, $(SCN)_3^-$, and $(SeCN)_3^-$, the ionic liquid comprising the corresponding anion, i.e. $I^-$, $Br^-$, $SCN^-$, or $SeCN^-$, resulting in the formation of the corresponding one of the redox couples $I^-/I_3^-$, $Br^-/Br_3^-$, $SCN^-/(SCN)_3^-$ and $SeCN^-/(SeCN)_3^-$.

In one embodiment, the electrolyte further comprises a soluble additive that acts as a source of protons or alkali metal ions. Preferably, the electrolyte further comprises lithium triflate (LiCF3SO3) or the potassium analogue, lithium tetrafluoroborate (LiBF4) or the potassium analogue, lithium hexafluorophosphate (LiPF6) or the potassium analogue, lithium perchlorate (LiClO4) or the potassium analogue, or lithium trifluoromethylsulfonimide (LiTFSI) or the potassium analogue.

Suitably, the specific conductivity of the electrolyte exceeds $10^{-6}$ S/cm. Preferably, the specific conductivity of the electrolyte exceeds $10^{-4}$ S/cm. Most preferably, the specific conductivity of the electrolyte exceeds $10^{-2}$ S/cm.

Preferably, the electrochemical transistor further comprises an encapsulating layer encapsulating the electrolyte. Suitably, the electrochemical transistor has an operational voltage less than 2V.

In one embodiment, there is provided an electrochromic display device comprising pixel switches, the pixel switches including an electrochemical transistor as described above.

BRIEF DESCRIPTION OF THE DRAWINGS

Embodiments of the present invention will now be described by way of further example only and with reference to the accompanying drawings, in which.

DETAILED DESCRIPTION

Figure 1:
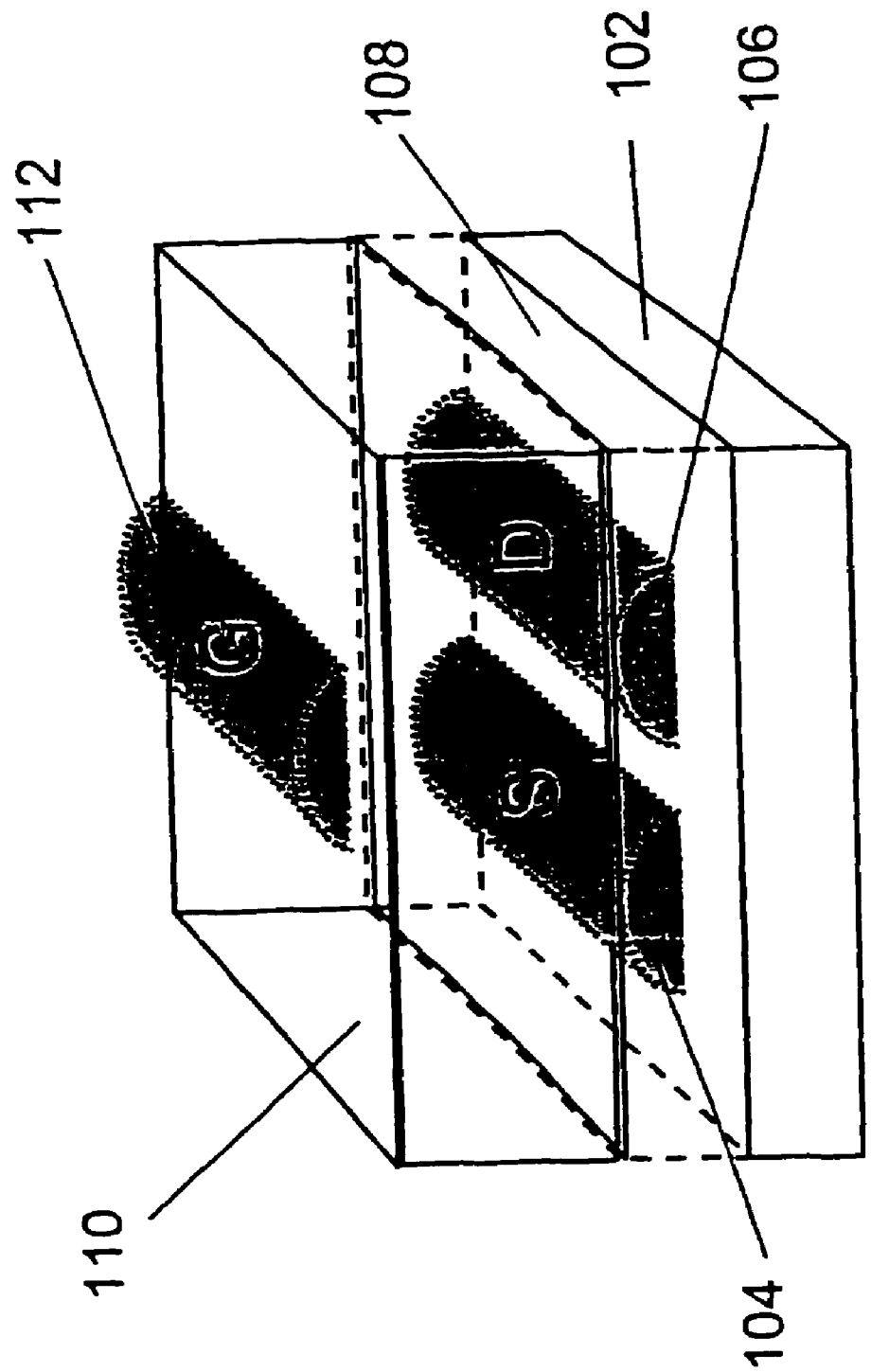
FIG. 1 shows a prior art OFET in a top-gate configuration.

FIG. 1 illustrates a prior art polymer OFET, wherein source 104 and drain 106 contacts disposed on a substrate 102 are covered by a thin layer of a semiconducting polymer 108, followed by an insulating polymer layer 110 (the dielectric) and the top-gate electrode 112.

When the OFET uses a p-type (n-type) semiconductor material 108, the source and drain contacts 104, 106 must comprise a high (low) work function material in order to minimize the contact resistance at the source contact-semiconductor interface. In the example of the OFET discussed below in comparison to an IL-ECT (see FIG. 7), the source and drain contacts 104, 106 were patterned from an evaporated gold layer on a glass substrate 102. The channel length L was 20 µm and the width W was 1 mm.

The semiconductor layer 108 must be thin and may be deposited using either spin-coating or inkjet-printing. The example of an OFET discussed below comprised a 40 nm thick spin-coated layer of the p-type fluorene-bithiophene copolymer ADS2008 (supplied by American Dye Source, Inc.).

The insulating polymer layer 110 must be sufficiently thick to prevent leakage currents and the breakdown of the dielectric. In the example of an OFET discussed below, the polymer dielectric 110 was approximately 800 nm thick and was deposited by spin-coating. The gate electrode 112 on top of the dielectric layer 110 may be formed by inkjet printing a metal colloid (as done in the example of an OFET discussed below), or by thermal evaporation of a metal in combination with a shadow mask.

Figure 2:
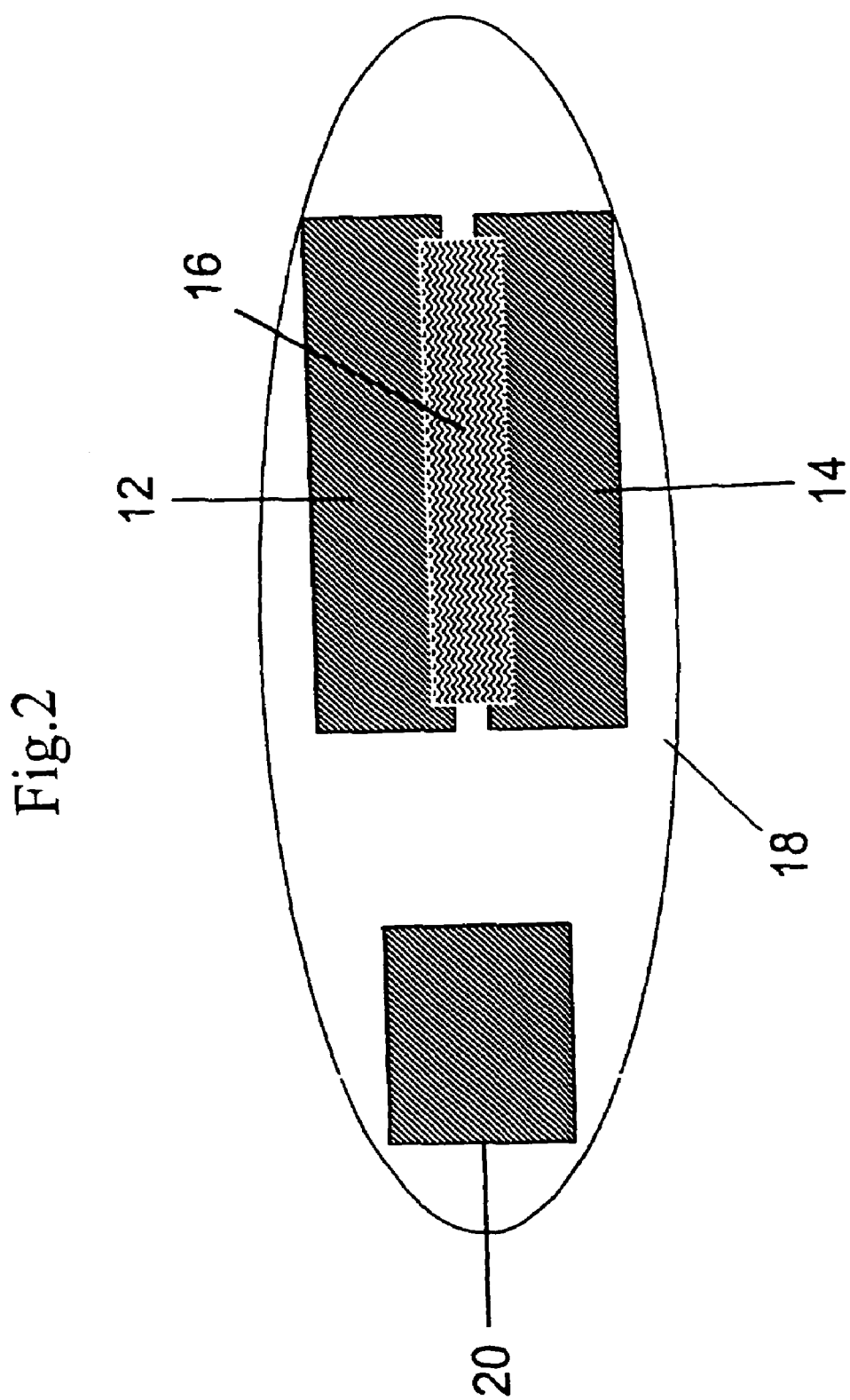
FIG. 2 displays a top-view of an Ionic Liquid-gated Electrochemical Transistor (IL-ECT) in accordance with an embodiment of the invention.

FIG. 2 shows a top view of the basic elements of an ionic liquid-gated electrochemical transistor (IL-ECT). A source and a drain electrode 12, 14 are fabricated on an insulating glass substrate 10 and are separated by a gap, which defines the transistor channel. A layer 16 of a semiconductor material bridges the gap between the source and drain electrodes 12, 14 and thus forms the transistor channel. A lateral gate electrode 20 is positioned in close proximity to the source and drain electrodes 12, 14. The gate electrode 20 is positioned at a distance of several millimeters from the source and drain contacts 12, 14. An electrolyte layer 18 comprising an ionic liquid is in contact with the gate electrode 20 and completely covers the semiconductor material 16 in the transistor channel. The drop of ionic liquid 18 covering the transistor channel allows the oxidation state of the semiconductor material 16 in the channel to be controlled.

In the following, the possible material choices for the basic elements of IL-ECTs are discussed.

(A) Source Drain, and Gate Electrodes

The source, drain, and gate electrodes 12, 14, 20 are preferably made from an electrochemically inert material such as gold, platinum, palladium, or a conductive form of carbon, in order to prevent electrochemical corrosion upon operation whilst in contact with the electrolyte 18.

(B) The Semiconductor Material in the Transistor Channel

The semiconductor material 16 in IL-ECTs may be p-type or n-type, i.e. doping may occur anodically (by oxidation, resulting in hole conduction), or cathodically (by reduction, resulting in electron conduction). Also, the transistor channel in IL-ECTs may comprise a single material or a combination of several, p-type or n-type, semiconductor materials. Furthermore, the semiconductor material(s) may be inorganic, metal-organic, or organic, and the semiconductor may comprise small molecules, oligomers, or polymers.

(B1) P-Type Semiconductor Materials

The semiconductor material 16 in the transistor channel may be a p-type organic semiconductor material comprising small molecules such as pentacene, phthalocyanine, tetrabenzoporphyrine, or (biphenyl)tetrathiafulvalene. Alternatively, the semiconductor material may be a p-type organic semiconductor material comprising an oligomer such as di-hexyl quaterthiophene, alpha-sexithiophene, a thiophene-phenylene oligomer, or a thiophene-thiazole oligomer. Also, the p-type organic semiconductor material may be a polymer such as poly[3-hexylthiophene] (P3HT), poly[5,5'-bis(3-dodecyl-2-thienyl)-2,2'-bithiophene] (PQT-12), or poly[9,9-dioctylfluorene-co-bithiophene] (ADS2008).

Other possible p-type semiconductor materials for IL-ECTs include metal-organic complexes such as Cu-phthalocyanine, Mg-phthalocyanine, or Zn-phthalocyanine. Furthermore, such metal organic complexes may be oligomeric, as in Si-phthalocyanine or Ru-phthalocyanine, or even polymeric.

(B2) N-Type Semiconductor Materials

The semiconductor material 16 in the transistor channel may be an n-type organic semiconductor material comprising small molecules such as perylenetetracarboxylicacid dianhydride (PTCDA), dimethylperylenetetracarboxylicacid diimide (MePTCDI), fullerene ($C_{60}$), $C_{60}$-fused pyrrolidine-meta-$C_{12}$ phenyl (C60MC12), or [6,6]-phenyl $C_{61}$-butyric acid methyl ester (PCBM). The n-type organic semiconductor material may also be oligomeric comprising thiazole oligomers with 4-trifluormethylphenyl groups, thiazole/thiophene co-oligomers with 4-trifluormethylphenyl groups, perfluoroarene-capped oligothiophenes such as 5,5'''-diperfluorophenyl-2,2':5',2'':5'',2'''-quaterthiophene, or perfluorinated phenylene dendrimers such as $C_{60}F_{42}$ or $C_{132}F_{90}$. Also, the n-type organic semiconductor material may be a polymer such as polybenzimidazobenzophenanthroline (BBL or poly[2-methoxy-5-(2'-ethylhexyloxy)-1,4-(1-cyanovinylene) phenylene (MEH-CN-PPV).

Other possible n-type semiconductor materials for IL-ECTs include metal-organic complexes such as perfluoro-vanadyl-phthalocyanine, perfluoro-copper-phthalocyanine, tetrapyridotetraazaporphyrinato zinc(II) (TPyTAPZn), tris(8-quinolinolato)aluminium ($Alq_3$), tris (4-methyl-8-quinolinolato)aluminium ($Almq_3$), bis(10-hydroxybenzo[h]-quinolinato)beryllium ($BeBq_2$), bis(2-methyl-8-quinolinolato)-(4-hydroxy-biphenylyl)-aluminium (BAlq), bis[2-(2-hydroxypheyl)-benzoxazolato]zinc ($Zn(BOX)_2$), or bis[2-(2-hydroxypheyl)-benzothiazolato]zinc ($Zn(BTZ)_2$).

The n-type semiconductor material may also be an inorganic metal oxide such as tungsten trioxide ($WO_3$), titanium dioxide ($TiO_2$), zinc oxide ($ZnO_2$), tin oxide ($SnO_2$), or indium tin oxide (ITO), or a metal chalcogenide such as cadmium sulphide (CdS) or cadmium selenide (CdSe).

If the semiconductor material 16 is an inorganic compound such as a metal oxide (e.g. tungsten trioxide, $WO_3$), the ionic liquid electrolyte 18 must comprise a soluble additive that acts as a source of protons or alkali metal ions. This allows for a faster insertion of cations into the metal oxide during its reduction, as the organic cations of the ionic liquid will in general be too large and therefore difficult to insert. Possible sources of alkali ions include lithium triflate ($LiCF_3SO_3$), lithium tetrafluoroborate ($LiBF_4$), lithium hexafluorophosphate ($LiPF_6$), lithium perchlorate ($LiClO_4$), or lithium trifluoromethylsulfonimide (LiTFSI).

The semiconductor material 16 in IL-ECTs may vary in thickness. Thin semiconductor layers allow for faster doping and de-doping of the material in the transistor channel, whereas thicker layers allow for higher source-drain current levels. This is due to the fact that during the electrochemical doping of IL-ECTs, the charge carriers accumulate in the bulk of the semiconductor material 16, not just at the interface to the dielectric as in OFETs.

(C) The Ionic Liquid-Based Electrolyte

The ionic liquid 18 may be chosen to comprise organic cations such as 1,3-dialkyl imidazolium, N-alkyl pyridinium, N,N-dialkyl pyrrolidinium, tetraalkyl phosphonium ($R_4P^+$), tetraalkyl ammonium ($R_4N^+$), and trialkyl sulfonium ions ($R_3S^+$), together with inorganic anions such as alkylsulfate, tosylate, methanesulfonate, bis(trifluoromethylsulfonyl)imide, hexafluorophosphate, tetrafluoroborate, or halides, amongst others.

The choice of the cation/anion combination in the ionic liquid 18 determines the redox (i.e. the electrochemical) behaviour of the electrolyte 18 in the IL-ECT device. The ionic liquid 18 may either be electrochemically inert, or comprise an ion component that is electrochemically active and can be reversibly oxidized or reduced.

(C1) IL-ECTs with Electrochemically Inert Ionic Liquids

The ionic liquid 18 may be chosen to display a large window of electrochemical stability, i.e. the ionic liquid 18 may comprise cations with a low electron affinity (which are difficult to reduce), and anions with a high ionisation potential (which are difficult to oxidise).

Examples of ionic liquids that are electrochemically inert include triethylsulphonium bis(trifluoromethylsulfonyl)imide, N-methyl-N-trioctylammonium bis(trifluoromethylsulfonyl)imide, N-butyl-N-methylpyrrolidinium bis(trifluoromethylsulfonyl)imide, 1-ethyl-3-methylimidazolium tetrafluoroborate, 1-ethyl-3-methylimidazolium trifluoromethylsulfonate, or 1-ethyl-3-methylimidazolium bis(trifluoromethylsulfonyl)imide.

The electrochemical doping of a neutral semiconductor material 16 in the transistor channel results in the insertion of counter-ions from the electrolyte 18 into the bulk of the neutral semiconductor material 16. Correspondingly, the de-doping of a doped semiconductor material 16 results in the release of counter-ions from the bulk of the doped semiconductor material 16 into the electrolyte 18. Specifically, p-doping (i.e. the electrochemical oxidation) of a semiconductor material 16 in the transistor channel requires the insertion of anions from the electrolyte 18 into the bulk of the semiconductor material 16.

Thus, in order to maintain charge neutrality within the electrolyte 18, the gate electrode 20 either has to release an equivalent amount of anions or electrons into the electrolyte 18, or remove an equivalent amount of cations from the electrolyte 18.

The present invention offers several ways to satisfy the requirement of charge neutrality in IL-ECTs, which are detailed in the following.

(C1.1) IL-ECTs with Capacitive Gate Counter Electrodes

Figure 3:
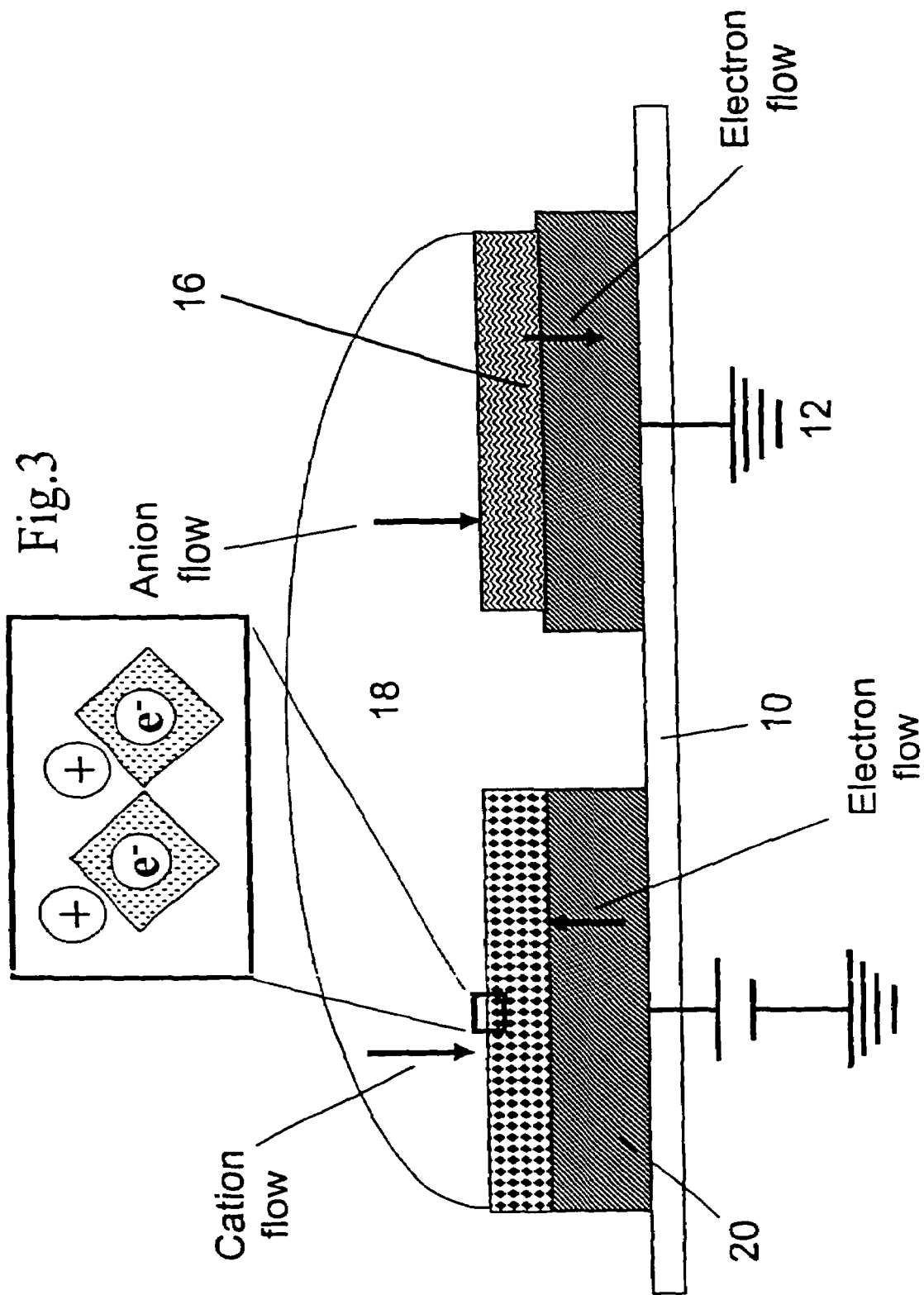
FIG. 3 displays a side-view of an Ionic Liquid-gated Electrochemical Transistor (IL-ECT) with a capacitive gate electrode, in accordance with an embodiment of the invention.

FIG. 3 illustrates an IL-ECT having source and drain contacts 12, 14, together with a lateral gate electrode 20, all simultaneously defined on a glass substrate 10. The gate electrode 20 is positioned at a distance of several millimeters from the source and drain contacts 12, 14 and comprises an electrochemically inert, porous surface. A thin layer of semiconductor material 16 made of a p-type polymer is in contact with the source electrode 12 (and the drain electrode 14, not shown in FIG. 3). The source, drain, and gate electrodes 12, 14, 20 are covered with a drop of an ionic liquid 18. FIG. 3 displays the electron and ion flows upon application of a negative gate voltage.

FIG. 3 displays the case where both the gate electrode material and the ionic liquid electrolyte 18 are electrochemically inert. In this case, the exchange of ions between the gate electrode 20 and the electrolyte 18 may occur capacitively, i.e. by the charging or de-charging of an ionic double-layer capacitance at the interface between the gate electrode 20 (a "capacitive" counter-electrode) and the electrolyte 18. This mechanism is a pure interface effect and does not involve any electrochemical effect.

In order to compensate for the large amount of charge involved in the electrochemical doping of the bulk of the semiconductor material 16 in the transistor channel, the interface between the gate electrode 20 and the electrolyte 18 has to be much larger than the interface between the electrolyte 18 and the semiconductor material 16 in the transistor channel. This may be achieved by using a gate electrode 20 with a porous, electrochemically inert surface comprising a particulate material such as carbon black (see inset in FIG. 3).

(C1.2) Electrochemical Strategies to Preserve Charge Neutrality

The exchange of ions between the semiconductor material 16 in the transistor channel and the electrolyte 18 may also be counterbalanced by a complementary (i.e. opposite) redox reaction occurring at the gate electrode 20. Specifically, when a p-type semiconductor material 16 in the transistor channel is doped by electrochemical oxidation, a complementary electrochemical reduction is required to occur at the gate electrode 20.

The present invention provides two options to allow for such complementary electrochemical reactions to occur: (1) using an additional, electrochemically active material that is insoluble in the ionic liquid electrolyte 18 and that is coated onto the gate electrode 20 (termed an "ion storage layer" in the following discussion), or (2) using a redox couple dissolved in the ionic liquid electrolyte 18.

(C1.2.1) IL-ECTs with an Ion Storage Layer

Figure 4:
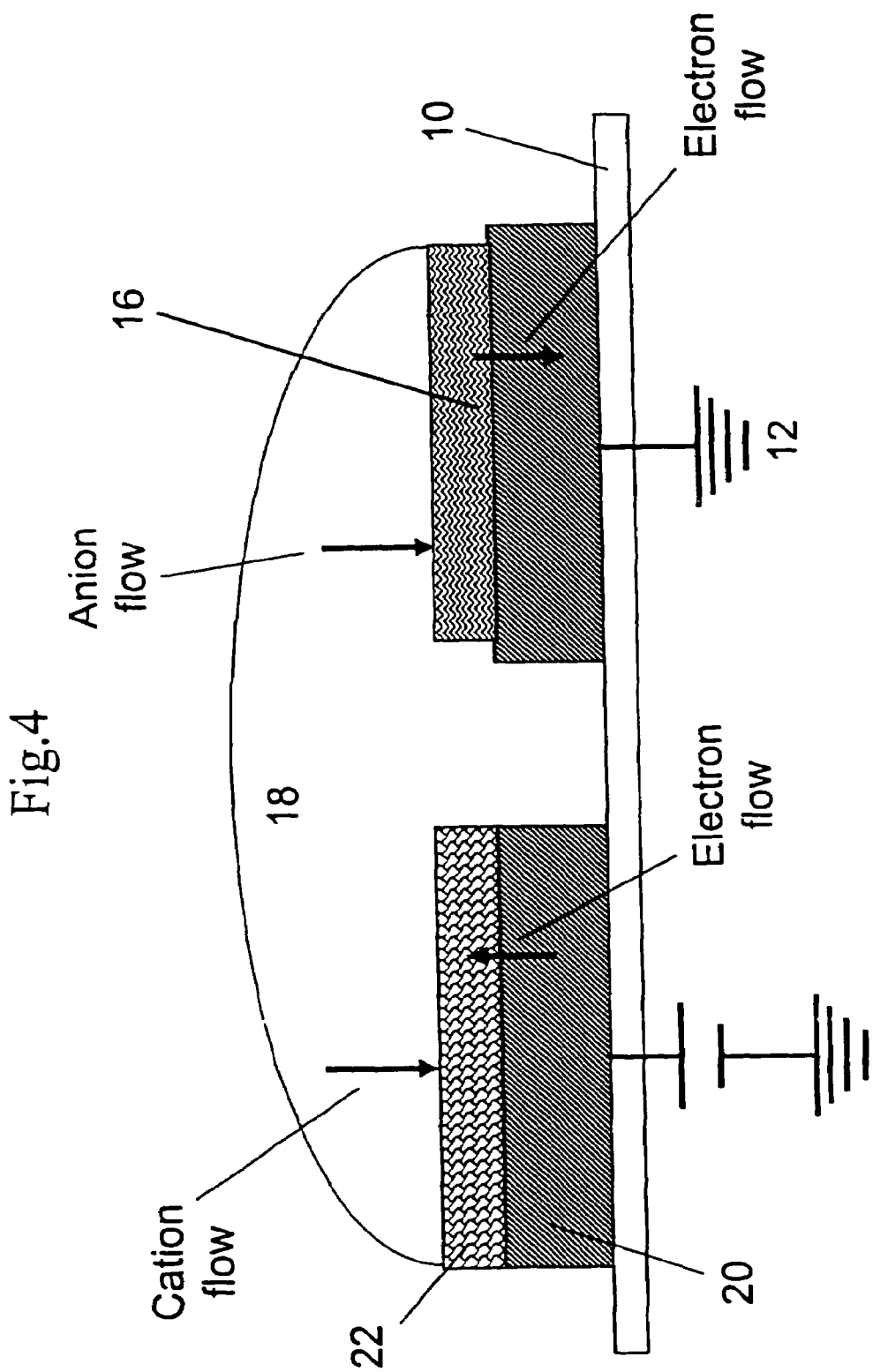
FIG. 4 displays a side-view of an Ionic Liquid-gated Electrochemical Transistor (IL-ECT) with an ion storage layer, in accordance with an embodiment of the invention.

FIG. 4 shows an IL-ECT having source and drain contacts 12, 14 together with a lateral gate electrode 20, all simultaneously defined on a glass substrate 10. The gate electrode 20 is positioned at a distance of several millimeters from the source and drain contacts 12, 14 and is covered by an ion storage layer 22. A thin layer of a semiconductor material 16 made of p-type material is in contact with the source electrode 12 (and the drain electrode 14, not shown in FIG. 4). The source, drain, and gate electrodes 12, 14, 20 are covered with a drop of an ionic liquid 18. FIG. 4 illustrates the electron and ion flows upon application of a negative gate voltage.

FIG. 4 displays the case where an ion storage material 22 is coated onto the gate electrode 20, and acts as an ion sink and source during the electrochemical switching of the IL-ECT. Doping of the p-type semiconductor material 16 in the transistor channel (i.e. switching the IL-ECT to its ON-state) results in the ion storage material 22 being reduced. Conversely, the de-doping of the p-type semiconductor material 16 in the transistor channel (i.e. switching the IL-ECT to its OFF-state) requires the oxidation of the ion storage material 22 on the gate electrode 20.

A requirement for the ion storage material 22 is therefore that it displays a redox activity that is complementary to the semiconductor material 16 in the transistor channel. In the case of a p-type semiconductor material forming the transistor channel, the ion storage layer 22 must allow for a reversible reduction reaction to occur.

The ion storage layer 22 may therefore comprise an electrochemically active material in an oxidized redox state, which can be reversibly switched between said oxidized redox state and a reduced redox state. Examples are metal oxides such as tungsten trioxide ($WO_3$), which can be reversibly reduced to $LiWO_3$.

Furthermore, the ion storage layer 22 may comprise an electrochemically active material in an intermediate redox state, which can be reversibly switched between said intermediate redox state and a reduced redox state. An example of a material for such ion storage layers is polyaniline in the emeraldine salt form, which can be reduced to the leucoemeraldine base form. Another example is Prussian Blue, which can be reduced to Prussian White.

Finally, the ion storage layer 22 may comprise an electrochemically active material in its neutral redox state, which can be reversibly switched between said neutral redox state and an n-doped redox state. Examples of materials for such ion storage layers include the n-type semiconductor materials listed above at (B2).

In the case of an n-type semiconductor material forming the transistor channel, the ion storage layer 22 must be reversibly oxidized when the transistor is switched to its ON-state.

The ion storage layer 22 may therefore comprise an electrochemically active material in an intermediate redox state, which can be reversibly switched between said intermediate redox state and an oxidized redox state. An example of a material for such ion storage layers is polyaniline in the emeraldine salt form, which can be oxidized to the pernigraniline form. Another example is Prussian Blue, which can be oxidized to Prussian Green.

Furthermore, the ion storage layer 22 may comprise an electrochemically active material in its neutral redox state, which can be reversibly switched between said neutral redox state and its p-doped, oxidized redox state. Such an ion storage layer 22 may comprise any of the p-type semiconductor materials above at (B1).

If the ion storage layer 22 comprises an inorganic compound such as a metal oxide (e.g. tungsten trioxide, $WO_3$), the electrolyte 18 must comprise a soluble additive that acts as a source of protons or alkali metal ions, in order to allow for the insertion of cations into the metal oxide during its reduction. The organic cations of the ionic liquid will in general be too large to be inserted easily into the inorganic compound of the ion storage layer. Possible sources of alkali ions include lithium triflate ($LiCF_3SO_3$), lithium tetrafluoroborate ($LiBF_4$), lithium hexafluorophosphate ($LiPF_6$), lithium perchlorate ($LiClO_4$), or lithium trifluoromethylsulfonimide (LiTFSI).

(C1.2.2) IL-ECTs with Redox Couples

Figure 5:
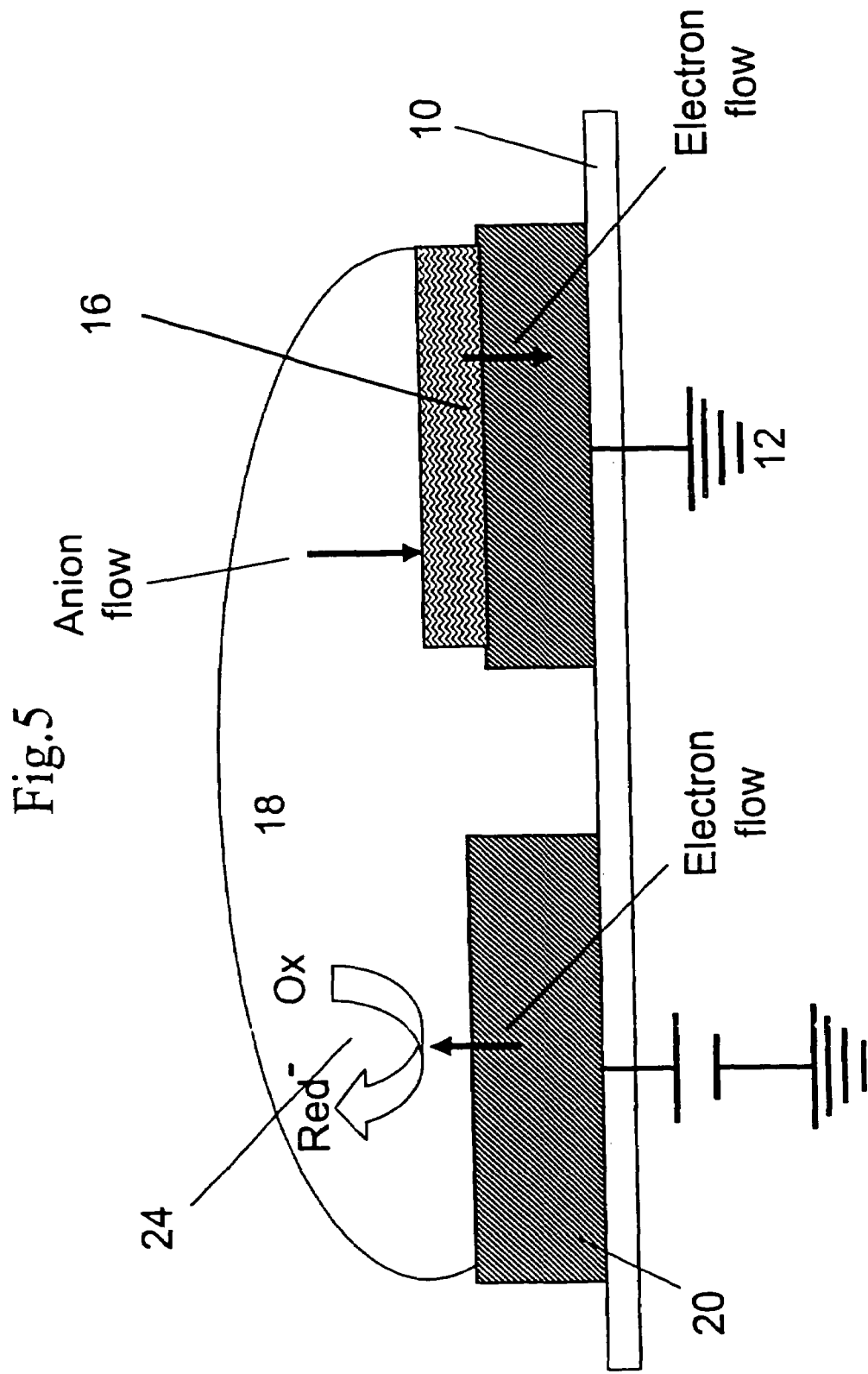
FIG. 5 displays a side-view of an Ionic Liquid-gated Electrochemical Transistor (IL-ECT) with a redox couple dissolved in the ionic liquid, in accordance with an embodiment of the invention.

FIG. 5 shows an IL-ECT comprising source and drain contacts 12 together with a lateral gate electrode 20, all simultaneously defined on a glass substrate 10. The electrochemically inert gate electrode 20 is positioned at a distance of several millimeters from the source and drain contacts 12, 14. A thin layer of a semiconductor material 16 made of p-type polymer is in contact with the source electrode 12 (and the drain electrode 14, not shown in FIG. 5). The source, drain, and gate electrodes 12, 14, are covered with a drop of an ionic liquid 18. FIG. 5 displays the electron and ion flows and the reduction of a redox couple in the ionic liquid 18 upon application of a negative gate voltage.

As an alternative to depositing an insoluble ion storage material onto the gate electrode, charge neutrality in the electrolyte 18 may be maintained by exchange of electrons between the gate electrode 20 and an electrochemically active redox couple 24 dissolved in the electrochemically inert ionic liquid 18. This is illustrated in FIG. 5. In this case, the electrochemically inert ionic liquid 18 comprises a combination of at least two electrochemically active additives, which form the electrochemically reversible redox couple 24. Such redox couples have been previously studied for application in Dye Sensitized Solar Cells (DSSCs). Examples of such redox couples (labelled "Red$^-$" and "Ox" in FIG. 5) include the $I^-/I_3^-$, $Br^-/Br_3^-$, $SCN^-/(SCN)_3^-$, $SeCN^-/(SeCN)_3^-$, $Co^{2+}/Co^{3+}$, and $Ce^{3+}/Ce^{4+}$ redox couples.

Furthermore, in cases where the IL-ECT is not encapsulated and is in contact with air, the presence of oxygen and moisture dissolved in the ionic liquid 18 allows for the occurrence of redox reactions at the gate electrode 20 that are complementary to the redox reactions of the semiconductor material 16 in the transistor channel. Thus, in the embodiment of an IL-ECT with a capacitive gate electrode 20 described above, the reduction at the gate electrode 20 of species such as protons (from water molecules) or oxygen molecules dissolved in the ionic liquid 18 can be assumed to occur in addition to the charging of the ionic double-layer capacitance at the gate electrode-electrolyte interface.

(C2) Electrochemically Active Ionic Liquids

The ionic liquid 18 may be chosen to comprise cations with a low electron affinity (which are difficult to reduce), and anions that form reversible redox couples with their oxidation products. In such cases, only the corresponding oxidation product has to be added to the ionic liquid 18 in order to form a redox couple.

Examples of such ionic liquids include 1-methyl-3-propyl-imidazolium iodide, 1-butyl-3-methylimidazolium bromide, 1-ethyl-3-methyl-imidazolium thiocyanate, and 1-ethyl-3-methyl-imidazolium selenothiocyanate.

Addition of the respective oxidized species, $I_3^-$, $Br_3^-$, $(SCN)_3^-$, or $(SeCN)_3^-$, to the ionic liquid 18 that comprises the corresponding anion, i.e. $I^-$, $Br^-$, $SCN^-$, or $SeCN^-$, then results in the formation of the electrochemically reversible redox couples $I^-/I_3^-$, $Br^-/Br_3^-$, $SCN^-/(SCN)_3^-$ or $SeCN^-/(SeCN)_3^-$, respectively.

Figure 6:
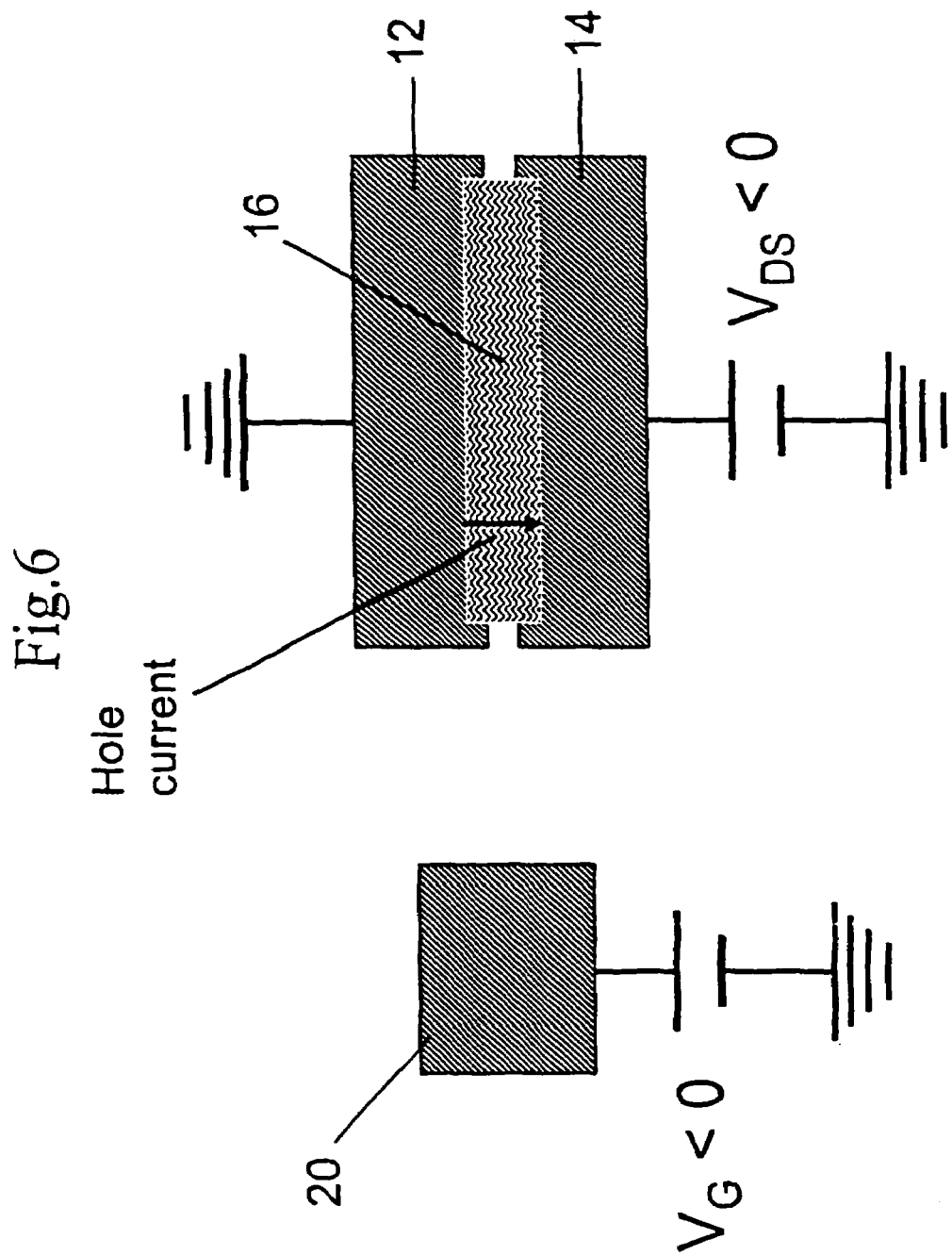
FIG. 6 illustrates the hole-current flow upon application of a negative gate voltage and a negative source-drain voltage to an IL-ECT in accordance with an embodiment of the invention (the IL-ECT is in its ON-state).

FIG. 6 shows the case of an IL-ECT where the application of a negative potential $V_G$ to the gate electrode 20 has resulted in the electrochemical oxidation (i.e. p-doping) of the semiconductor material 16 in the transistor channel. In other words, the transistor is in its ON-state. When a negative voltage $V_{DS}$ is applied to the drain electrode 14, holes flow from the source 12 to the drain electrode 14. The device may be switched back to the OFF-state by reversing the polarity of the gate voltage, i.e. by application of a positive $V_G$.

Conversely, in the case of a n-type semiconductor material in the transistor channel, application of a positive potential $V_G$ to the gate electrode 20 results in the electrochemical reduction (i.e. n-doping) of the semiconductor material in the transistor channel. Application of a positive voltage $V_{DS}$ to the drain electrode 14 will then result in an increased electron current through the transistor channel, i.e. the transistor is in the ON-state. The n-type device may then be switched back to its OFF-state by reversing the polarity of the gate voltage, i.e. by application of a negative $V_G$.

EXAMPLES

First Example

IL-ECT with a Capacitive Gate Electrode

The electrical characteristics of an example of an IL-ECT with a capacitive gate electrode are discussed below (see FIGS. 7 and 8). The source, drain, and gate electrodes in this example were patterned from an evaporated gold layer on a glass substrate. The channel length L was 20 μm and the width W of the channel was 1 mm, as in the case of the OFET of FIG. 7. Furthermore, the IL-ECT comprised a 40 nm thick spin-coated layer of the p-type organic fluorene-bithiophene copolymer ADS2008 (supplied by American Dye Source, Inc.), the same material and thickness as in the case of the OFET. The electrolyte comprised the ionic liquid 1-ethyl-3-methylimidazolium trifluoromethylsulfonate (EMI-TFSI), supplied by Toyoh Gosei Inc., Japan.

Second Example

IL-ECT with an Emeraldine Base Salt as an Ion Storage Layer

As in the first example, the IL-ECT of the second example comprised source, drain, and gate electrodes patterned from an evaporated gold layer on a glass substrate. The channel length L was 20 μm, and the width W of the channel was 1 mm. Furthermore, the IL-ECT comprised a 40 nm thick spin-coated layer of the p-type organic fluorene-bithiophene copolymer ADS2008 (supplied by American Dye Source, Inc.). The electrolyte comprised the ionic liquid 1-ethyl-3-methylimidazolium trifluoromethylsulfonate (EMI-TFSI), supplied by Toyoh Gosei Inc., Japan.

In the second example, an ion storage layer comprising polyaniline in the form of an emeraldine salt was deposited onto the gate electrode.

Third Example

IL-ECT Comprising an N-Type Inorganic Semiconductor, a Redox Couple Dissolved in the Ionic Liquid, and a Lithium Ion Source Dissolved in the Ionic Liquid Again, the IL-ECT of the third example comprised source, drain, and gate electrodes patterned from an evaporated gold layer on a glass substrate. The channel length L was 20 μm, and the width W of the channel was 1 mm. In the third example, the IL-ECT comprised a thermally evaporated, 20 nm thick layer of the n-type inorganic semiconductor tin(IV) sulphide ($SnS_2$). The electrolyte comprises the ionic liquid 1-ethyl-3-methylimidazolium trifluoromethylsulfonate (EMI-TFSI), supplied by Toyoh Gosei Inc., Japan.

Lithium iodide (LiI) and iodine ($I_2$) were dissolved in the EMI-TFSI ionic liquid, resulting in the formation of the $I^-/I_3^-$ redox couple. In addition, the LiI acts as a lithium ion source, providing lithium cations for the electrochemical reduction of the $SnS_2$ semiconductor.

Transfer and Output Characteristics of the First Example

Figure 7:
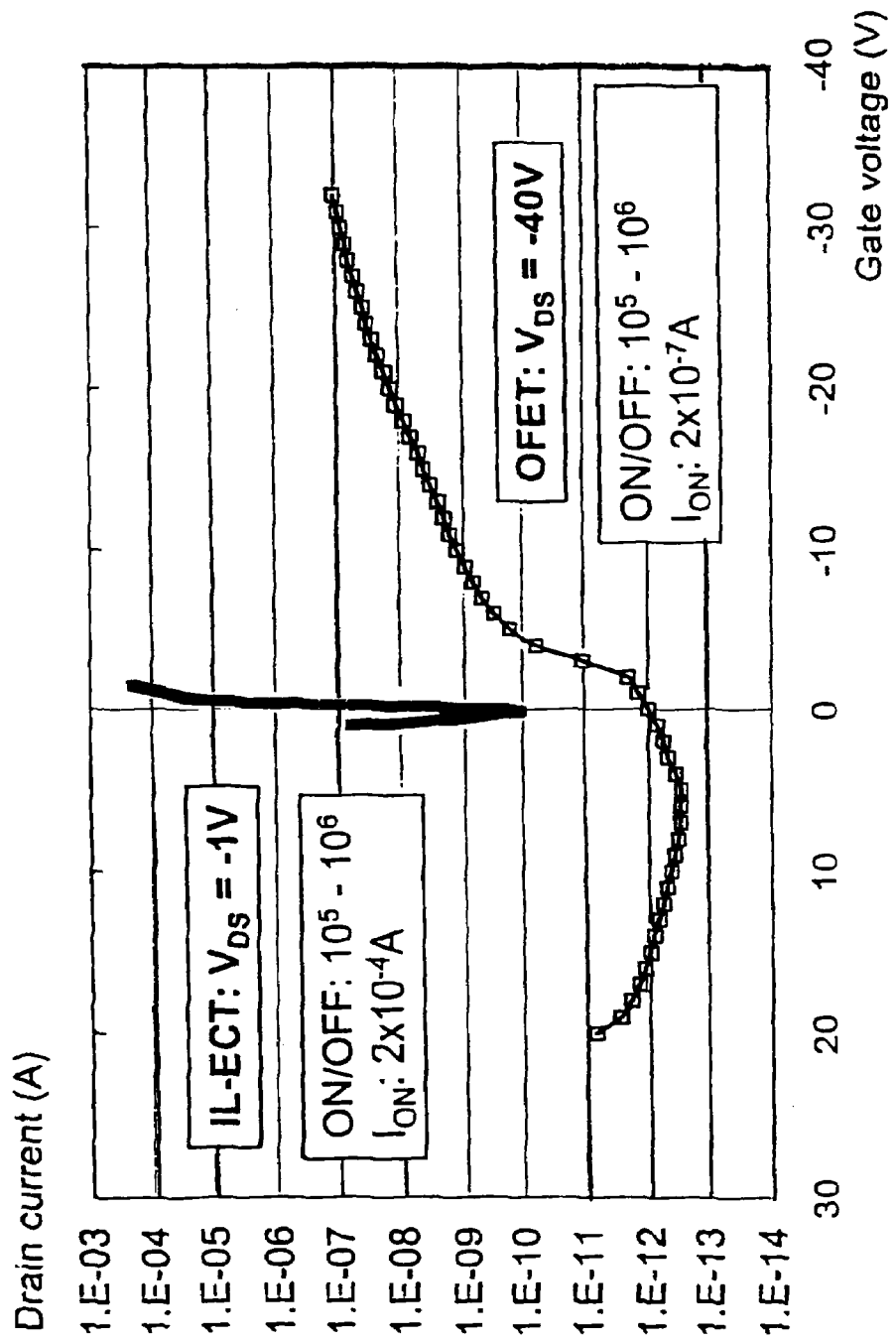
FIG. 7 displays a comparison of the transfer characteristics (i.e. a plot of $log(I_{DS})$ vs. $V_G$, where $I_{DS}$ is the source-drain current and $V_G$ is the gate voltage) of a conventional polymer OFET and an ionic liquid-gated electrochemical transistor (IL-ECT) in accordance with an embodiment of the invention.

FIG. 7 shows a comparison of the transfer characteristics (i.e. a plot of $\log(I_{DS})$ VS. $V_G$) for a conventional polymer OFET and an ionic liquid-gated electrochemical transistor (IL-ECT) according to the first example. Both the OFET and the IL-ECT comprised identical source and drain electrode patterns, which were defined on a glass substrate by photolithographic patterning of a thermally evaporated gold film. The gold film was approximately 100 nm thick, with a thin Cr adhesion layer. In both devices, the lengths and widths of the transistor channels were 20 µm and 1 mm, respectively. Furthermore, the composition and thickness of the semiconductor material in both devices was identical: a 40 nm thick layer of the fluoro-bithiophene co-polymer ADS2008, as supplied by "American Dye Source, Inc.".

The transfer curves for the OFET and the IL-ECT were recorded for forward sweeps with source-drain voltages ($V_{DS}$) of −40V and −1V, respectively. Both devices displayed similar ON/OFF current ratios in the range of $10^5$-$10^6$. However, the current levels in the IL-ECT were approximately $10^3$ times higher than those in the OFET, both in the ON- and the OFF-state. Furthermore, the gate voltage ($V_G$) required for operating the IL-ECT was drastically reduced compared to the gate voltage required for operating the OFET (about 2V instead of 30V). This makes IL-ECTs ideal candidates for addressing pixels in electrochromic displays, which require relatively large switching currents in combination with small switching voltages.

Figure 8:
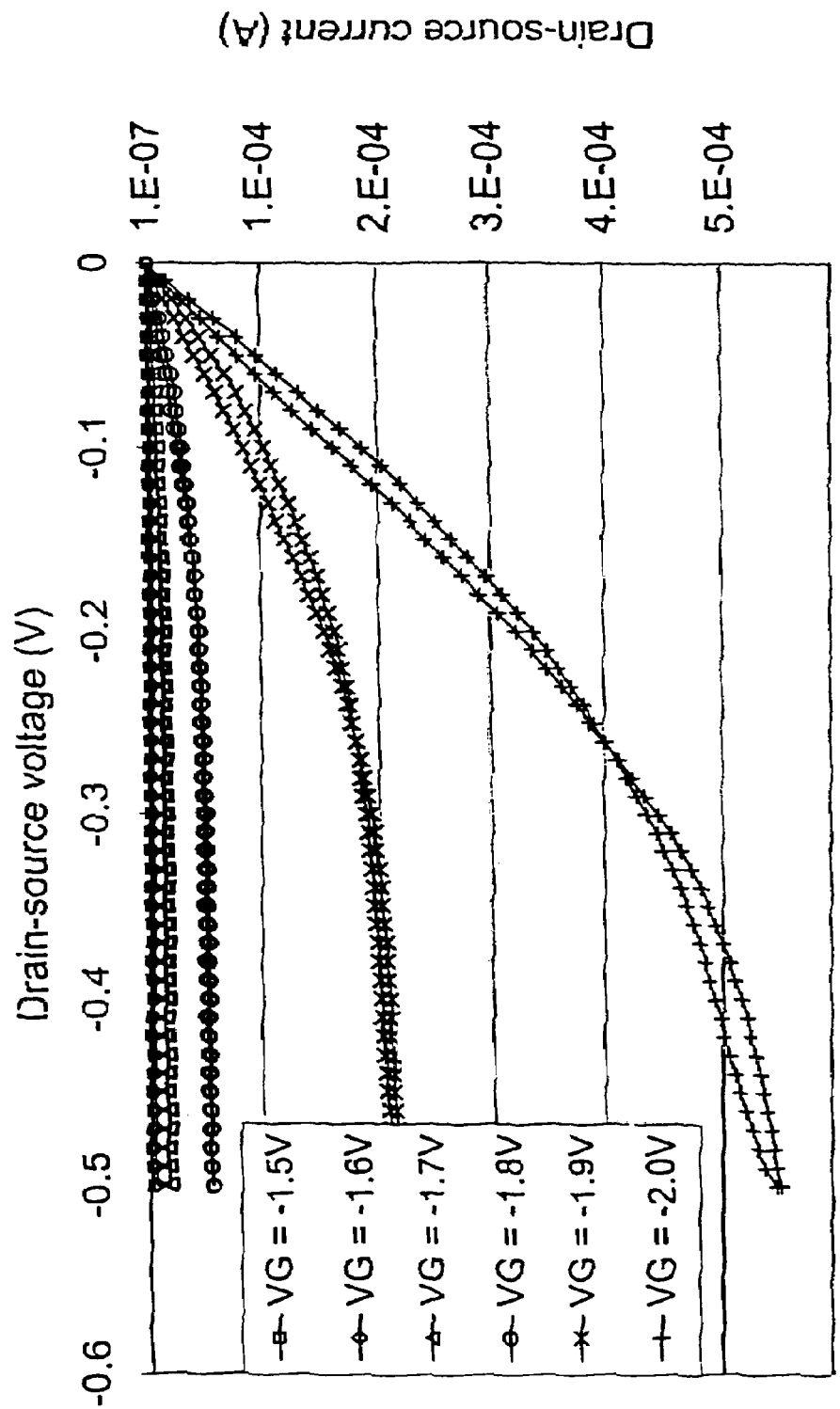
FIG. 8 displays the output characteristics (i.e. a plot of $I_{DS}$ vs. $V_{DS}$, where $V_{DS}$ is the source-drain voltage, for a range of discrete gate voltages $V_G$) of an ionic liquid-gated electrochemical transistor (IL-ECT) in accordance with an embodiment of the invention.

FIG. 8 displays the output characteristics (i.e. plots of $I_{DS}$ VS. $V_{DS}$) for an ionic liquid-gated electrochemical transistor (IL-ECT). Forward and reverse sweeps were recorded for gate voltages $V_G$ ranging from −1.5V to −2.0V. Current saturation in the output was clearly observed, and occurs at very low source-drain voltages (e.g. below $|V_{DS}|=0.5V$ for $V_G$ ranging from −1.5V to −1.9V).

The main effect of the invention is to provide transistors (IL-ECTs) that display much higher current levels at much lower driving voltages than conventional polymer OFETs. In the example of an IL-ECT given above, the current level was a factor of $10^3$ times larger than in an OFET with an identical transistor channel width-to-length ratio (W/L), thickness and semiconductor material.

Furthermore, ON/OFF current ratios in excess of $10^5$ can be achieved by applying gate voltage variations as low as 2V, and saturation of the transistor output current is observed at source-drain voltages as low as −0.5V.

This combination of high current outputs at low source-drain voltages and large current modulations in response to small modulations of the applied gate voltage makes IL-ECTs ideal candidates for the switching of electrochromic display pixels that require large switching currents in combination with low driving voltages.

An additional effect of the invention is that, compared to other electrochemical transistors based on conjugated organic materials known in the prior art, the replacement of water-based or solid polymer-based electrolytes with ionic liquid-based electrolytes drastically increases the operational cycle lifetime of the transistors.

Finally, as ionic liquids are non-volatile, the shelf-lifetimes of electrochemical transistors using ionic liquid-based electrolytes in accordance with the invention are improved compared to devices comprising water-based or organic solvent-based electrolytes.

The aforegoing description has been given by way of example only and it will be appreciated by a person skilled in the art that modifications can be made without departing from the scope of the present invention.

What is claimed is:

1. A transistor, comprising:
a source electrode;
a drain electrode;
a semiconductor material contacting the source electrode and the drain electrode;
an electrolyte contacting the semiconductor material;
an ion storage material contacting the electrolyte,
the ion storage material being electrochemically active; and
a gate electrode contacting the ion storage material;
wherein, while the semiconductor material displays a first redox activity, the ion storage material displays a complementary redox activity.

2. The transistor according to claim 1, further comprising:
a substrate on which the gate electrode, the source electrode and the drain electrode are disposed.

3. The transistor according to claim 2, the electrolyte covering the semiconductor material and the ion storage material.

4. The transistor according to claim 1, each of the gate electrode, the source electrode and the drain electrode including an electrochemically inert metal.

5. The transistor according to claim 4, the semiconductor material including a p-type semiconductor material and the ion storage material including an electrochemically active material that can be switched reversibly between an oxidized redox state and a reduced redox state.

6. The transistor according to claim 4, the semiconductor material including a p-type semiconductor material and the ion storage material including an electrochemically active material that can be switched reversibly between an intermediate redox state and a reduced redox state.

7. The transistor according to claim 4, the semiconductor material including a p-type semiconductor material and the ion storage material including an electrochemically active material that can be switched reversibly between a neutral redox state and a n-doped redox state.

8. The transistor according to claim 4, the semiconductor material including a n-type semiconductor material and the ion storage material including an electrochemically active material that can be switched reversibly between an intermediate redox state and an oxidized redox state.

9. The transistor according to claim 4, the semiconductor material including a n-type semiconductor material and the ion storage material including an electrochemically active material that can be switched reversibly between a neutral redox state and a p-doped redox state.

10. The transistor according to claim 1, the electrolyte including triethylsulphonium bis(trifluoromethylsulfonyl)imide, N-methyl-N-trioctylammonium bis(trifluoromethylsulfonyl)imide, N-butyl-N-methylpyrrolidinium bis(trifluoromethylsulfonyl)imide, 1-ethyl-3-methylimidazolium tetrafluoroborate, 1-ethyl-3-methylimidazolium trifluoromethylsulfonate, or 1-ethyl-3-methylimidazolium bis(trifluoromethylsulfonyl)imide.

11. The transistor according to claim 1, the electrolyte including a combination of at least two electrochemically active additives, which constitute at least one electrochemically reversible redox couple.

12. The transistor according to claim 1, the electrolyte including a soluble additive that acts as a source of protons or alkali metal ions.

13. The transistor according to claim 1, the electrolyte including lithium triflate (LiCF3SO3) or the potassium analogue, lithium tetrafluoroborate (LiBF4) or the potassium analogue, lithium hexafluorophosphate (LiPF6) or the potassium analogue, lithium perchlorate (LiClO4) or the potassium analogue, or lithium trifluoromethylsulfonimide (LiTFSI) or the potassium analogue.

14. The transistor according to claim 1, the semiconductor material being porous.

15. The transistor according to claim 1, the electrolyte being electrochemically inert.

16. The transistor according to claim 1, the electrolyte including an anion component that is electrochemically active and that can be reversibly oxidized.

17. The transistor according to claim 1, further comprising:
an encapsulating layer encapsulating the electrolyte.

18. An electrochromic display device comprising:
the transistor according to claim 1; and
an electrochromic display pixel being switched by the transistor.

19. The transistor according to claim 1, wherein the electrolyte includes an ionic liquid.

20. A transistor, comprising:
a source electrode;
a drain electrode;
a p-type semiconductor material contacting the source electrode and the drain electrode;
an electrolyte contacting the p-type semiconductor material;
a metal oxide material contacting the electrolyte, the metal oxide material being electrochemically active; and
a gate electrode contacting the metal oxide material, the gate electrode being electrochemically inert.

* * * * *